United States Patent [19]

Gurcan et al.

[11] Patent Number: 4,974,236

[45] Date of Patent: Nov. 27, 1990

[54] ARRANGEMENT FOR GENERATING AN SSB SIGNAL

[75] Inventors: Mustafa K. Gurcan, Crawley, England; Anne Watteau, Villeneuve D'Ascq, France

[73] Assignee: U.S. Philips Corporation, New York, N.Y.

[21] Appl. No.: 294,312

[22] Filed: Jan. 6, 1989

[30] Foreign Application Priority Data

Jan. 6, 1988 [GB] United Kingdom ............... 8800244

[51] Int. Cl.$^5$ .................. H04L 27/02; H03C 1/60
[52] U.S. Cl. .................... 375/061; 332/170; 455/109
[58] Field of Search ............ 375/43, 61; 455/46, 455/47, 109; 332/41, 42, 44, 45, 167, 170, 149

[56] References Cited

U.S. PATENT DOCUMENTS

| | | | |
|---|---|---|---|
| 3,605,017 | 9/1971 | Chertok | 375/61 |
| 3,793,589 | 2/1974 | Puckette | 375/61 |
| 3,835,391 | 9/1974 | Fang | 375/61 |
| 3,868,601 | 2/1975 | MacAfee | 375/61 |
| 3,918,001 | 11/1975 | Sailer et al. | 375/61 |
| 4,086,536 | 4/1978 | Acker | 455/109 |

OTHER PUBLICATIONS

IRE Proceedings; Dec. 1956, pp. 1703–1705, Weaver, Donald K., "A Third Method of Generating and Detection of Single Sideband Signals".

*Primary Examiner*—Benedict V. Safourek
*Attorney, Agent, or Firm*—David R. Treacy

[57] ABSTRACT

An SSB generator in which a digitized analogue signal is processed in accordance with Weaver's method. The baseband I and Q signals are interpolated at a sampling frequency $f_s$ in respective first interpolators (30, 32). The interpolated signals are frequency up-converted to an output SSB carrier frequency $Nf_s$ by applying said signals to respective second interpolators (38, 40) in which the signals are sampled at $4Nf_s$. The samples at the outputs of the second interpolators (38, 40) are applied to a multiplexer (42) which provides a digitized version of the SSB signal which is converted to an analogue signal and filtered.

19 Claims, 5 Drawing Sheets

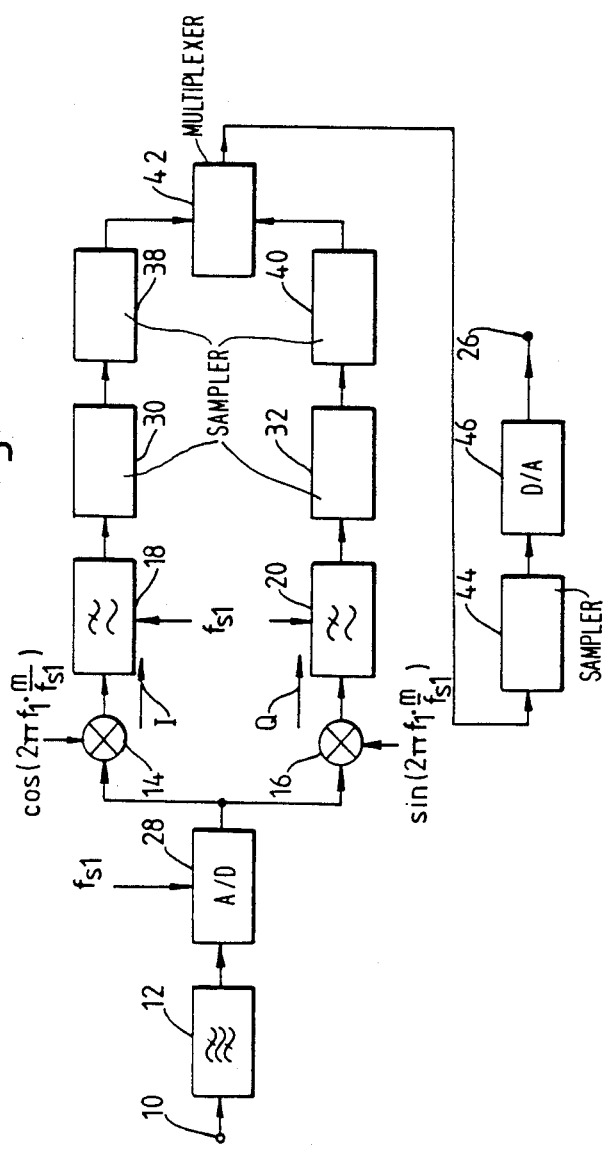
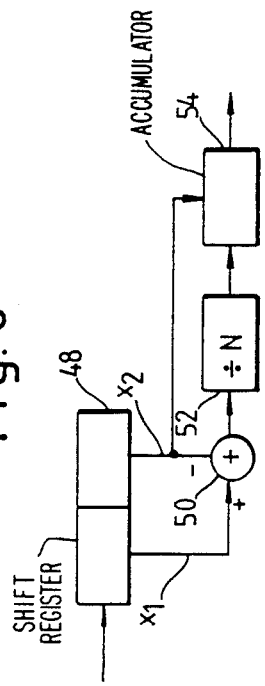

ARRANGEMENT FOR GENERATING AN SSB SIGNAL

BACKGROUND OF THE INVENTION

The present invention relates to an arrangement for generating an SSB signal and has applications in both the analogue and conventional digital implementations single sideband modulators constructed in accordance with what is termed Weaver's method. Such modulators are used in SSB generation in speech and data transmission for mobile radios.

Weaver's method is disclosed in Proceedings of the IRE "A Third Method of Generation and Detection of Single-Sideband Signals" Donald K. Weaver, Jr., pages 1703 to 1705. FIG. 1 of the accompanying drawings illustrates a modulator made in accordance with Weaver's method. An analogue input signal at an input 10 is band limited in a bandpass filter 12 and then is applied to balanced mixers 14, 16 where it is mixed with quadrature related carrier signals $\cos(\omega_0 t)$ and $\sin(\omega_0 t)$, where $\omega_0 t$ is a carrier frequency corresponding to the centre of the passband of the signal from the filter 12. As a result of these mixing operations quadrature related signals I and Q are produced which have single sideband components at base band and unwanted components at high frequencies. The wanted components of the I and Q signals are selected by low pass filters 18, 20 and then frequency up-converted to their carrier frequency $(\omega_c t)$ in balanced mixers 22, 24. The signals from these mixers are combined in a summing circuit 25 to provide an output on a terminal 26.

In data transmission a similar arrangement to that shown in FIG. 1 is used to frequency up-convert the baseband I and Q modulated signals corresponding to the data. Weaver's method may also be used to generate constant envelope signals suitable for mobile radio digital transmission.

A drawback to Weaver's method is that it is difficult to implement the frequency up-converting or RF section as an integrated circuit. Reasons for this difficulty include the fact that matching of the mixers 22, 24 (FIG. 1) is complicated and it may be necessary to run the mixers at a high power level to achieve the desired performance. Also it is necessary to make a pair of quadrature local oscillators capable of generating a wide range of frequencies. Any mismatch in the mixers or any imperfection in the quadrature RF signal generation may cause the unwanted signal levels to increase.

Mismatch problems mentioned above can be overcome by generating digital samples of the RF local oscillators and using digital multipliers instead of the RF mixers. This is shown in FIG. 2 of the accompanying drawings which illustrate a conventional digital implementation of Weaver's method. In FIG. 2 the output of the bandpass filter 12 is digitised in an analogue-to-digital converter 28 which is sampled at a clock frequency $f_{s1}$. The digitised signals are applied to mixers 14, 16 which respectively receive digitised local oscillator signals $\cos[(2\pi f_1 \cdot (m/f_{s1})]$ and $\sin(2\pi f_1 \cdot m/f_{s1})$. The I and Q signals from the mixers are low pass filtered in digital filters 18, 20 which are clocked at the frequency $f_{s1}$ which satisfies the Nyquist sampling rate. The output signals which have been sampled at $f_{s1}$ are applied to respective interpolators 30, 32 operating at a sampling frequency $Nf_s$. The outputs of the interpolators 30, 32 are frequency up-converted in digital multipliers 34, 36 to which are supplied quadrature carrier signals $\cos[2\pi f_c \cdot (n/Nf_s)]$ and $\sin[2\pi f_c \cdot (n/Nf_s)]$, respectively. The outputs from the digital multipliers 34, 36 are combined in the summing circuit 25 and the R.F. output appears on the terminal 26. This digital implementation of Weaver's method enables a performance improvement to be achieved at the expense of increased power consumption as digital multipliers require more power than the equivalent analogue mixers. The generation of RF quadrature signal samples raises another problem for radio transmitter integration when constant frequency sampling is required at RF. The sine and cosine samples can be generated by using either look-up tables or on-line processing but neither method is attractive for integration.

SUMMARY OF THE INVENTION

An object of the present invention is to provide an integratable SSB generator which is economical in its use of power.

According to a first aspect of the present invention there is provided an SSB generator comprising means for providing quadrature related digitised first and second input signals at baseband frequencies, interpolating means for frequency up-converting said first and second signals, and multiplexing means coupled to the interpolating means for multiplexing the frequency up-converted first and second input signals to provide a digitised SSB signal having a desired carrier frequency.

The interpolating means may comprise first and second interpolating means, the first interpolating means serving to sample respectively the first and second signals at a frequency $(f_s)$ greater than the digitising frequency and the second interpolating means serving to sample the signals from the first interpolating means at a multiple of the first mentioned sampling frequency. The multiplexing means may be arranged to multiplex the samples at the sampling frequency of the second interpolating means.

Implementing the interpolating means as first and second interpolating means enables each to be adapted to the task required of it. The first interpolating means operates as a digital filter and serves to increase the repetition rate of the signal from a digital low pass filter to make it suitable for linear interpolation in the second interpolating means. The second interpolating means operates as a linear interpolator which lifts the frequency up to RF.

In an embodiment of the present invention the sampling frequency used in the second interpolation operation is 4N times the sampling frequency $(f_s)$ used in the first interpolation operation, that is $4Nf_s$, and the multiplexing operation is carried out at a clock frequency of $4Nf_s$ to provide the SSB signal at $Nf_s$.

The multiplexed output may be interpolated for a third time in order to shift the sampling frequency $4Nf_s$ to a higher frequency outside the bandwidth of a low pass filter connected to a digital to analogue converter coupled to the multiplexing means.

The second interpolation means may be adapted to calculate the values of all the samples of the frequency up-converted first and second digitised signals. Alternatively power can be saved by only calculating the values of those samples which after multiplexing will contribute to the final signal. In order to do this only the odd-numbered samples in one of the first and second interpolated signals are calculated and only the even-numbered samples in the other of the first and second interpolated signals are calculated.

The present invention will be explained and described, by way of example, with reference to the accompanying drawing.

BRIEF DESCRIPTION OF THE DRAWINGS

FIG. 3 is a block schematic diagram of an embodiment of an SSB modulator made in accordance with the present invention, FIG. 8 is a block schematic diagram of a linear interpolation filter.

In the drawings, the same reference numerals have been used to indicate corresponding features.

DESCRIPTION OF THE PREFERRED EMBODIMENTS

Figure 1:
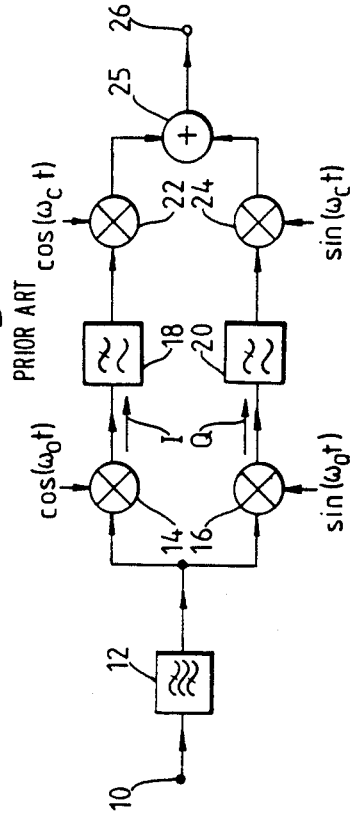
FIG. 1 is a block schematic diagram of an analogue modulator constructed in accordance with Weaver's method.
Figure 2:
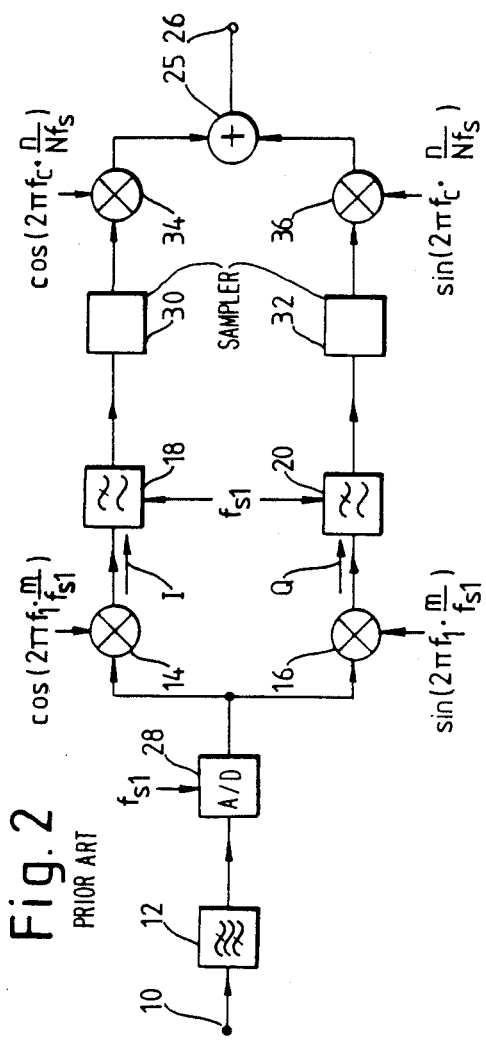
FIG. 2 is a block schematic diagram of a digitised modulator constructed in accordance with Weaver's method.

Referring to FIG. 3, the SSB modulator shown is essentially the same as that shown in FIG. 2 as far as the interpolators 30, 32 which are operating at a sampling frequency, $f_s$, which is of the order of 30 times higher than the frequency at the top end of the bandwidth of the low pass filters 18, 20. The outputs from the interpolators 30, 32 are applied to second interpolators 38, 40 operating at a higher sampling frequency, $Nf_s$, than $f_s$. The outputs from the second interpolators 38, 40 are multiplexed in multiplexer 42 to provide an output comprising the SSB signal centred on $Nf_s/4$ plus the sampling frequency component in the output from the multiplexer, the output is applied to a third interpolator 44 which has a sampling frequency which is an integer multiple of Nfs. A digital to analogue converter 46 is connected to the third interpolator 44 and provides an output on the terminal 26. By this technique the frequency band of the SSB signal is maintained around $f_s$ whilst the $Nf_s$ component is frequency up-converted to a frequency which lies outside the pass bandwidth of a filter in the DAC 46. If desired a superhet stage may be connected to the output 26 to increase the frequency of the SSB signal which in such a situation represents an IF signal.

Figure 4:
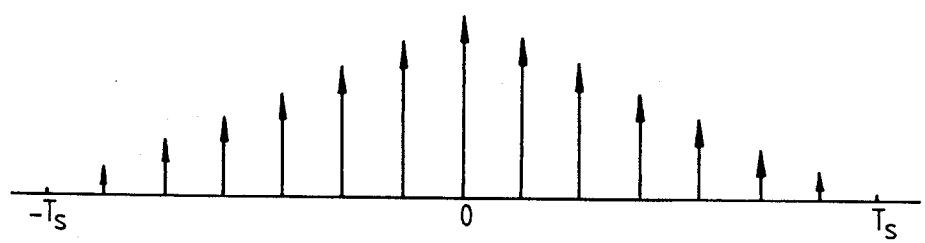
FIG. 4 shows the impulse response of an interpolating filter.
Figure 5:
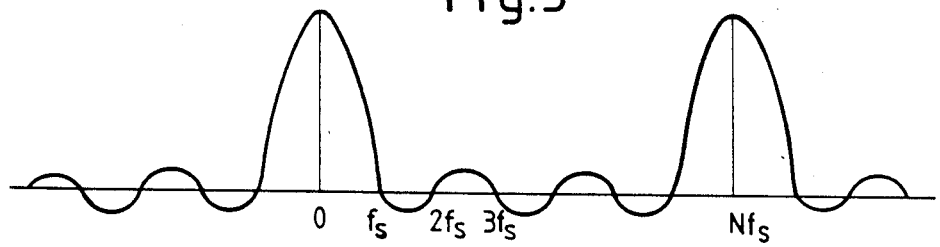
FIG. 5 shows the frequency response of an interpolating filter.

FIG. 4 shows the impulse response of an interpolating filter which may comprise the second interpolator 38 or 40. The ordinate represents amplitude and the abscissa time. The filter's response lasts two bit periods $\pm T_s$, where $T_s = 1/f_s$, and has a $\sin^2 x/x^2$ type of transfer function. The response shape is sampled at N times the sampling frequency $f_s$, that is at $Nf_s$. As shown in FIG. 5, the frequency response of the interpolating filter has zero crossings at each integer multiple of $f_s$, but the signal at $Nf_s$ will not be attenuated.

Thus when the signal samples, sampled at $f_s$, are applied to the interpolating filter, the filter as a consequence will eliminate all the signals between $f_s$ and $Nf_s$. The output produced comprises an interpolated version of the input signal having a new sampling frequency of $Nf_s$.

Figure 6:
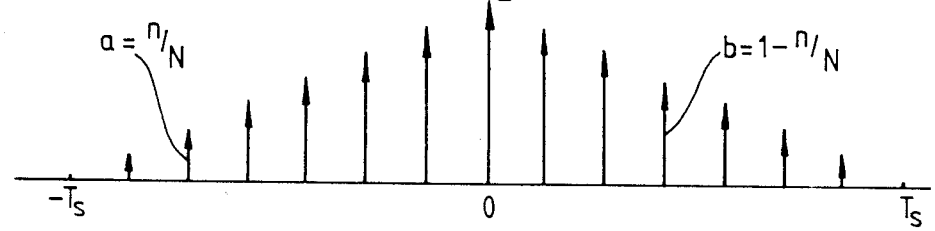
FIG. 6 shows the impulse response of an interpolating filter.
Figure 7:
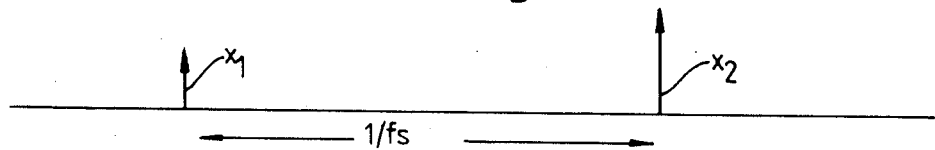
FIG. 7 shows two samples taken from the impulse response shown in FIG. 6, which samples are separated in time by $1/f_s$.

A simplified way of realising an interpolating filter will now be described with reference to FIGS. 6, 7 and 8. The value of N is determined by the highest required integer number used to increase the sampling frequency $f_s$. When using the interpolating filter having an impulse response as shown in FIG. 6, the filter response length is $-T_s$ to $T_s$ which equals $2/f_s$. Furthermore at any given time there will be only two samples $x_1$ and $x_2$ in the interpolating filter which will appear at instances separated by $T_s = 1/f_s$. Therefore in realising the interpolating filter as a transversal filter only two multipliers at a time are required together with an addition circuit to sum the multiplied signal samples. The resultant signal, y, appearing at the output of the filter will be given by:

$$y = ax_1 + bx_2 \qquad (1)$$

where a and b are the coefficients of the convolution of the filter at the nth and (n+N)th taps. Since the impulse response of the filter as shown in FIG. 6 has a triangular shape, the coefficients of a and b are given by:

$$a = n/N \qquad (2)$$

$$b = 1 - n/N \qquad (3)$$

where N is the integer multiple used to increase the sampling frequency.

Substituting equations (2) and (3) into equation (1) leads to:

$$y = ax_1 + bx_2 = x_2 + n(x_1 - x_2)/N.$$

This means that if the sampling frequency $f_s$ is to be increased by a factor of N, then one obtains the difference between adjacent samples, $x_1$ and $x_2$, at the sampling frequency $f_s$ and divide the result by the interpolation factor, N. The resulting quotient is then taken as an increment and added to the sample $x_2$ at every instant n to produce the interpolated samples of the input signal at the new sampling frequency $Nf_s$.

FIG. 8 illustrates an embodiment of the incrementing filter realised to implement $$y = x_2 + n(x_1 - x_2)/N.$$

The signal sampled at $f_s$ is applied to a shift-register or tapped delay line 48. Samples $x_1$ and $x_2$ separated by $1/f_s$ seconds are tapped off and applied to a subtractor 50 which produces the difference or increment $(x_1 - x_2)$ which is applied to a divider 52 in which the increment is divided by N. The quotient from the divider is added to the sample $x_2$ in an accumulator 54 to produce the interpolated samples of the input signal at the new sampling frequency $Nf_s$.

Figure 9:
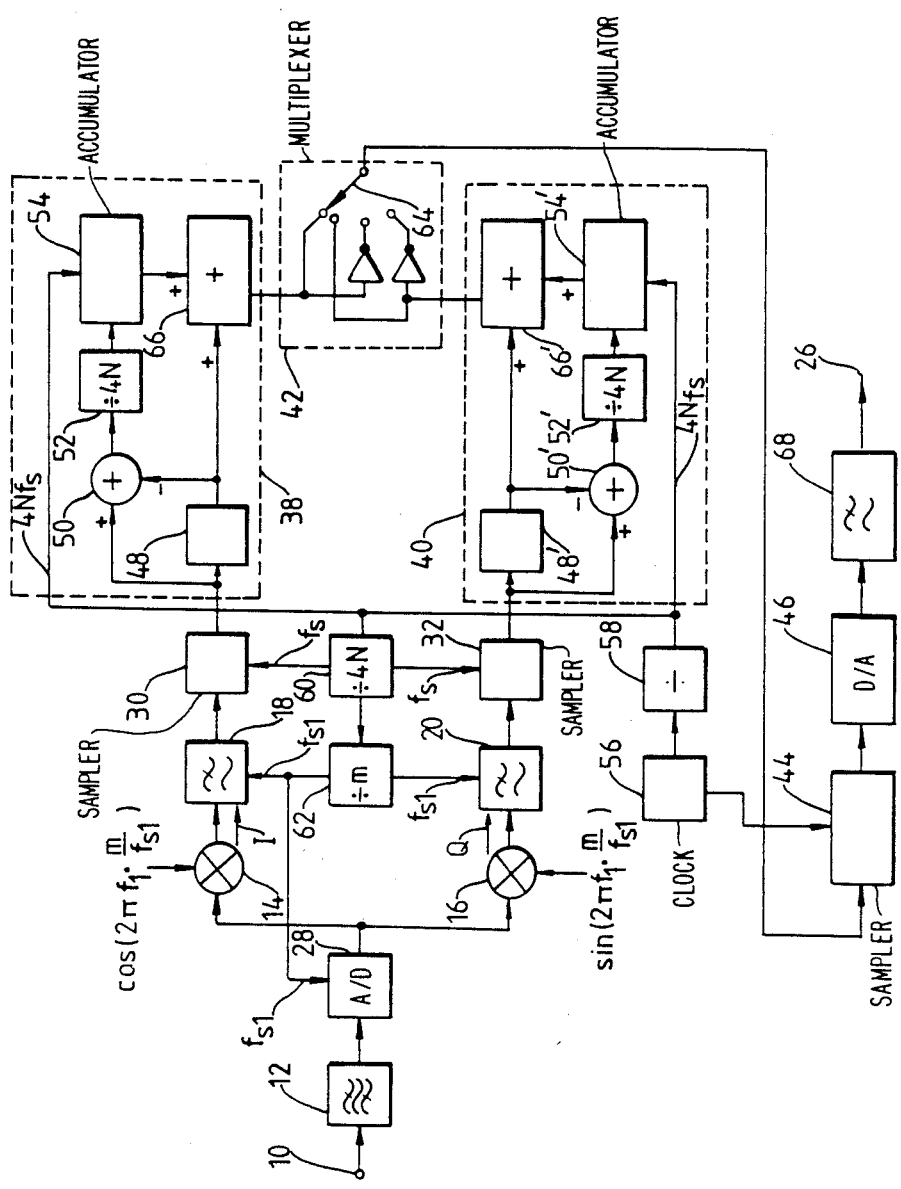
FIG. 9 is a block schematic diagram of an embodiment of a SSB modulator including the linear interpolation filter shown in FIG. 8.

FIG. 9 is a block schematic diagram of an SSB modulator made in accordance with the present invention.

The front end portion corresponds to that described with reference to and as shown in FIG. 3 and in the interests of brevity will not be described again. The second interpolators 38, 40 are based on the circuit as shown in FIG. 8 with some modifications. In the case of the second interpolator 40, the circuit stages which correspond to those used in the second interpolator 38 have been referenced using primed reference numerals, that is 48', 50', 52' and 54'. However the differences are divided by 4N in the dividers 52 and 52' and the accumulators 54, 54' are clocked at $4Nf_s$. The effect of doing this is that the increment is obtained by dividing the difference by 4N. The increment is then accumulated on the delayed signal sample $x_2$ at regular clocking points. The accumulation starts every time a new sample is loaded into the shift register or tapped delay line 48, 48' and continues for 4N clock periods until a new sample is loaded into the shift register so that the process is repeated for a new value of $x_2$.

The clock signal $4Nf_s$ is derived from a master clock 56 operating at a higher frequency than $4Nf_s$ and divided down in a divider 58. This divided down signal at $4Nf_s$ is divided by 4N in another divider 60 to provide clock signals at $f_s$, where $f_s$ has a value of the order of 100 KHz, to the interpolators 30, 32. The clock signal $f_{s1}$ for the A to D converter 28 and the digital low pass filters 18, 20 is derived by dividing $f_s$ by m, where m is of the order of 8, in a divider 62.

The multiplexer 42 provides an SSB signal at a nominal carrier frequency $Nf_s$ sampled at $4Nf_s$. The multiplexer 42 comprises the electronic equivalent of four pole switch 64 operating at $4Nf_s$. Proceeding from top to bottom in FIG. 9, the first and second poles are respectively connected to addition stages 66, 66' of the second interpolators 38, 40 which stages provide digital values of the samples. The third and fourth poles provide inverted forms of the signals on the first and second poles, respectively. The output from the multiplexer 42 comprises a digitised form of the SSB signal at the nominal carrier frequency $Nf_s$ and the unwanted sampling frequency at $4Nf_s$. In order to eliminate the unwanted sampling frequency the multiplexer output is applied to the third interpolator 44 in which it is sampled at the clock frequency of the master clock 6, which frequency is above the bandwidth of a low pass filter 68 connected to the output of the D to A converter 46. By this operation the sampling frequency $4Nf_s$ is eliminated by interpolation so that it is outside the bandwidth of the low pass filter 68.

The operation of the circuit shown in FIG. 9 will now be summarised. In order to produce the desired SSB signal, the required quadrature oscillator samples will be 1, 0, −1, 0, 1, 0 and 0, 1, 0, −1, 0,1 in the I and Q channels, respectively. In order to realise the RF section, these I and Q signal samples appearing at the outputs of the base band filters 18, 20 are interpolated to a sampling frequency $4Nf_s$ in the interpolators 30, 38 and 32, 40. These samples are multiplied with the RF oscillator samples (see above) so that the alternate products of the multiplication in the I and Q channels become equal to zero. The multiplexer 42 selects samples alternately from the I and Q channels, which samples after D to A conversion and filtering form the SSB signal on the output 26.

In order for the SSB modulator to be able to operate at a range of carrier frequencies it is necessary to vary the sampling frequencies used. In order to do this then for a certain carrier frequency $f_c$, the SSB signal sampling frequency $4Nf_s$ is selected to be 4 times higher than $f_c$. The sampling frequency $f_s$ for the interpolators 30, 32 is chosen by dividing $4Nf_s$ by 4N in the stage 60. The frequency $f_{s1}$ is produced by dividing $f_s$ by m in the stage 62. The master clock frequency is generated using a phase locked loop. The local oscillator frequency $f_1$ is kept constant.

Two numerical examples of how the frequencies are calculated will now be given. It will be assumed that it is desired to cover SSB generation over the frequency range 0 to 10 MHz and in consequence the bandwidth of the low pass filter 68 is 10 MHz. In the first numerical example it will be assumed that the SSB signal is to be transmitted at a frequency $Nf_s = 5$ MHz $4Nf_s = 20$ MHz $f_s$ should be of the order 100 kHz and therefore $N = 5000/100 = 50$ (and $4N = 200$).

If $m=8$ then $f_{s1} = 12.5$ KHz.

As $4Nf_s = 20$ MHz is outside the bandwidth of the low pass filter 68 it will be attenuated to an acceptable level. In this situation there is no need to use the third interpolator 44.

In the second numerical example it will be assumed that the SSB is to be transmitted at a frequency $Nf_s = 1$ MHz so that $4Nf_s = 4$ MHz, $f_s$ is maintained at 100 kHz and therefore $N = 1000/100 = 10$ (and $4N = 40$). The values of m and $f_{s1}$ are maintained at 8 and 12.5 kHz, respectively.

As $4Nf_s = 4$ MHz which is within the 10 MHz bandwidth of the low pass filter 68, the interpolation factor and the sampling frequency of the third interpolator 44 are set to 3 and 12 MHz, respectively. Thus the divider 58 divides the 12 MHz by 3 to obtain the desired $4Nf_s$.

If a new carrier frequency is chosen then the calculations are repeated and the master clock frequency and the respective divisors are determined accordingly.

By operating the multiplexer 42 at $4Nf_s$ odd numbered samples are selected from say the I channel and even numbered samples are selected from the other, Q channel. As a result the non-selected samples are not used. Consequently there is no need to calculate the even numbered samples in the I channel and the odd numbered samples in the Q channel. Thus the interpolation equation given in the description of FIG. 8 can be modified to form equations for $y_I$ and $y_Q$ where $y_I = x_2^I + 2n(x_1^I - x_2^I)/4N$ and $y_Q = x_2^Q + (2n+1)(x_1^Q - x_2^Q)/4N$.

As a result of this modification the second I and Q interpolators 38, 40 are operated at $2f_s$ and the signals are multiplexed at $4Nf_s$.

Figure 10:
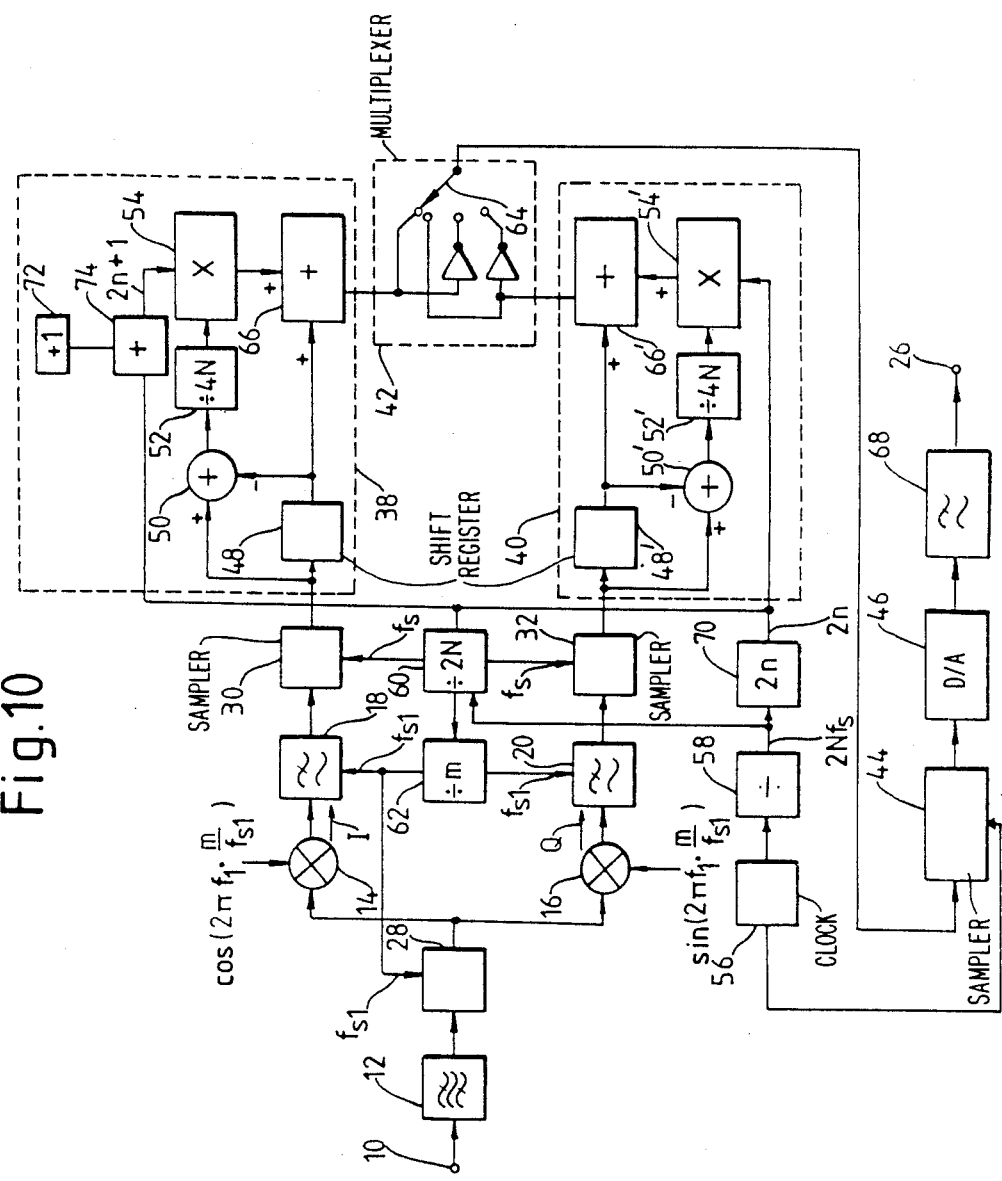
FIG. 10 is a block schematic diagram of another embodiment of an SSB modulator including an alternative linear interpolation filter to that shown in FIGS. 8 and 9.

An embodiment of the invention in which the modified equations are implemented is shown in FIG. 10. In the interests of brevity only the differences between the embodiments of FIGS. 9 and 10 will be discussed. The master clock 56 is connected to the divider 58 which produces an output signal at $2Nf_s$. The multiplexer 42 is still clocked at $4Nf_s$. The signal at $2Nf_s$ is supplied firstly to the divider 60 where it is divided down by 2N to provide the clock signal $f_s$ to the interpolators 30, 32 and secondly to increment a counter 70 two steps at a time. The counter 70 is reset at the instants when data is loaded into the shift registers 48, 48'. The output of the counter 70 is applied to a multiplier 54' and to an adder 74 in which it is added to +1 provided by a stage 72. The sum 2n+1 is supplied to the multiplier 54. In the multiplier 54 the number obtained from the divider is multiplied by 2n+1 to produce the increments for the I channel. Similarly in the multiplier 54' the output of the divider 52' is multiplied by 2n to produce the increments for the Q channel.

The SSB modulators shown in FIGS. 9 and 10 are capable of being fabricated as integrated circuits. If desired a signal processor may be used to realise the base band mixers 14, 16 and the interpolators 30, 32, 38 and 40.

We claim:

1. An SSB generator comprising means for providing quadrature related digitised first and second input signals at baseband frequencies, interpolating means for frequency up-covering said first and second signals, and multiplexing means coupled to the interpolating means for multiplexing the frequency up-converted first and second input signals to provide a digitised SSB signal having a desired carrier frequency, characterized in that the interpolating means comprises first and second interpolating means, the first interpolating means serving to sample respectively the first and second signals at a frequency ($f_s$) greater than the digitizing frequency and the second interpolating means serving to sample the signals from the first interpolating means at a multiple of the first mentioned sampling frequency, and the multiplexing means is arranged to multiplex the samples at the sampling frequency of the second interpolating means.

2. An SSB generator as claimed in claim 1, characterized in that the second interpolating means samples the signals at the output of the first interpolating means at a frequency 4N times the first mentioned sampling frequency, that is, at $4Nf_s$, where N is a positive integer greater than 1; and in that the multiplexing means is operated at $4Nf_s$ to provide an output signal at $Nf_s$.

3. An SSB generator as claimed in claim 2, characterized in that a digital to analogue converter (DAC) is coupled to the multiplexing means and a low pass filter connected to the output of the DAC.

4. An SSB generator as claimed in claim 3, characterized in that a third interpolating means is connected to an output of the multiplexing means, the third interpolating means being operated at a sampling frequency greater than the sampling frequency of the second interpolating means in order to place the interpolated latter sampling frequency outside the bandwidth of the low pass filter.

5. An SSB generator as claimed in claim 4, characterized in that the second interpolating means comprises means for implementing the equation $$y = ax_1 + bx_2$$
$$= x_2 + n(x_1 - x_2)/N$$

where said means for implementing comprises a further filter; y is a respective in-phase or quadrature signal produced by said second interpolating means; $x_1$ and $x_2$ are samples separated in time by $1/f_s$ of the impulse response of said further filter, $(x_1 - x_2)$ is the difference in amplitude of the two samples; n is a sample number, and N is the multiple of the sampling frequency ($f_s$) of the first interpolating means to obtain the SSB signal; and $a = n/N$ and $b = 1 - n/N$.

6. An SSB generator as claimed in claim 4, characterized in that the second interpolating means is arranged to operate on odd numbered samples of one of the quadrature related signals received from the first interpolating means and on even numbered samples of the other of the quadrature related signals received from the first interpolating means.

7. An SSB generator as claimed in claim 6, characterized in that the second interpolating means comprises means for implementing the interpolation equations $$y_I = x_2^I + 2n(x_1^I - x_2^I)/4N$$

and $y_Q = x_2^Q + (2n+1)(x_1^Q - x_2^Q)/4N$ where $y_I$ and $y_Q$ are the quadrature related signals produced by the second interpolating means, $x_1^I$, $x_2^I$ and $x_1^Q$, $x_2^Q$ are samples separated in time by $1/f_s$ of the impulse response of the filter, $(x_1^I - x_2^I)$ and $(x_1^Q - x_2^Q)$ are the differences in amplitude between the respective pairs of samples, n is a sample number, and N is the multiple of the sampling frequency ($f_s$) of the first interpolating means to obtain the SSB signal.

8. An SSB generator as claimed in claim 7, characterized in that the second interpolating means comprises, for each of the quadrature related signals, shift register means, means for sampling the amplitude of the bits stored, differencing means for obtaining the difference between the amplitudes of two bits separated in time by $1/f_s$, and means for adding the difference obtained to the amplitude of the second sample.

9. An SSB generator as claimed in claim 8, characterized in that the multiplexing means comprises means for providing the samples at the higher sampling frequency of the respective quadrature related signals and the inverted values of said respective quadrature related signals and means for scanning said sample and said inverted values.

10. An SSB generator as claimed in claim 1, characterized in that a digital to analogue converter (DAC) is coupled to the multiplexing means and a low pass filter connected to the output of the DAC.

11. An SSB generator as claimed in claim 10, characterized in that a third interpolating means is connected to an output of the multiplexing means, the third interpolating means being operated at a sampling frequency greater than the sampling frequency of the second interpolating means in order to place the interpolated latter sampling frequency outside the bandwidth of the low pass filter.

12. An SSB generator as claimed in claim 1, characterized in that the second interpolating means comprises means for implementing the equation $$y = ax_1 + bx_2$$
$$= x_2 + n(x_1 - x_2)/N$$

where said means for implementing comprises a further filter; y is a respective in-phase or quadrature signal produced by said second interpolating means; $x_1$ and $x_2$ are samples separated in time by $1/f_s$ of the impulse response of said further filter, $(x_1 - x_2)$ is the difference in amplitude of the two samples; n is a sample number, and N is the multiple of the sampling frequency ($f_s$) of the first interpolating means to obtain the SSB signal; and $a=n/N$ and $b=1-n/N$.

13. An SSB generator as claimed in claim 12, characterized in that the second interpolating means comprises, for each of the quadrature related signals, shift register means, means for sampling the amplitude of the bits stored, differencing means for obtaining the difference between the amplitudes of two bits separated in time by $1/f_s$, and means for adding the difference obtained to the amplitude of the second sample.

14. An SSB generator as claimed in claim 12, characterized in that the multiplexing means comprises means for providing the samples at the higher sampling frequency of the respective quadrature related signals and the inverted values of said respective quadrature related signals and means for scanning said sample and said inverted values.

15. An SSB generator as claimed in claim 1, characterized in that the second interpolating means is arranged to operate on odd numbered samples of one of the quadrature related signals received from the first interpolating means and on even numbered samples of the other of the quadrature related signals received from the first interpolating means.

16. An SSB generator as claimed in claim 15, characterized in that the second interpolating means comprises means for implementing the interpolation equations $$y_I = x_2^I + 2n(x_1^I - x_2^I)/4N$$

and $y_Q = x_2^Q + (2n+1)(x_1^Q - x_2^Q)/4N$ where $y_I$ and $y_Q$ are the quadrature related signals produced by the second interpolating means, $x_1^I$, $x_2^I$ and $x_1^Q$, $x_2^Q$ are samples separated in time by $1/f_s$ of the impulse response of the filter, $(x_1^I - x_2^I)$ and $(x_1^Q - x_2^Q)$ are the differences in amplitude between the respective pairs of samples, n is a sample number, and N is the multiple of the sampling frequency ($f_s$) of the first interpolating means to obtain the SSB signal.

17. An SSB generator as claimed in claim 15, characterized in that the second interpolating means comprises, for each of the quadrature related signals, shift register means, means for sampling the amplitude of the bits stored, differencing means for obtaining the difference between the amplitudes of two bits separated in time by $1/f_s$, and means for adding the difference obtained to the amplitude of the second sample.

18. An SSB generator as claimed in claim 15, characterized in that the multiplexing means comprises means for providing the samples at the higher sampling frequency of the respective quadrature related signals and the inverted values of said respective quadrature related signals and means for scanning said sample and said inverted values.

19. An SSB generator as claimed in claim 1, characterized in that the multiplexing means comprises means for providing the samples at the higher sampling frequency of the respective quadrature related signals and the inverted values of said respective quadrature related signals and means for scanning said sample and said inverted values.

* * * * *